(12) United States Patent
Liu et al.

(10) Patent No.: US 12,268,063 B2
(45) Date of Patent: Apr. 1, 2025

(54) DISPLAYING SUBSTRATE FOR PREVENTING SHORT CIRCUIT BETWEEN AUXILIARY ELECTRODES, AND DISPLAYING DEVICE USING THE SAME

(71) Applicant: BOE Technology Group Co., Ltd., Beijing (CN)

(72) Inventors: Fengjuan Liu, Beijing (CN); Ke Wang, Beijing (CN); Wei Liu, Beijing (CN); Tianmin Zhou, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 398 days.

(21) Appl. No.: 17/485,184

(22) Filed: Sep. 24, 2021

(65) Prior Publication Data
US 2022/0231109 A1    Jul. 21, 2022

(30) Foreign Application Priority Data

Jan. 15, 2021  (CN) .......................... 202110057134.7

(51) Int. Cl.
*H10K 59/131*    (2023.01)
*H10K 50/80*     (2023.01)
(Continued)

(52) U.S. Cl.
CPC .......... *H10K 59/131* (2023.02); *H10K 50/80* (2023.02); *H10K 59/126* (2023.02); *H10K 2102/311* (2023.02)

(58) Field of Classification Search
CPC .... H10K 59/131; H10K 50/80; H10K 59/126; H10K 2102/311; H10K 50/88;
(Continued)

(56) References Cited

U.S. PATENT DOCUMENTS

| 2016/0174358 A1* | 6/2016 | Wu .................. H05K 1/028 428/141 |
| 2017/0237032 A1* | 8/2017 | Koshihara ............ H10K 50/841 257/88 |

(Continued)

FOREIGN PATENT DOCUMENTS

KR    20190109680 A  *  1/2019   ............ H10K 59/124

*Primary Examiner* — Chad M Dicke
*Assistant Examiner* — Jeremy Daniel Watts
(74) *Attorney, Agent, or Firm* — IPro, PLLC (57) ABSTRACT

A displaying substrate and a displaying device. The displaying substrate comprises a flexible base plate; a first auxiliary electrode arranged on one side of the flexible base plate, the first auxiliary electrode being connected with a first power cord; a pixel unit arranged on a side of the flexible base plate away from a first metal layer, the pixel unit comprising: thin-film transistors arranged on the side of the flexible base plate away from the first metal layer, an insulation layer and a second auxiliary electrode, the second auxiliary electrode being connected with a second power cord, wherein the plurality of thin-film transistors comprise a drive transistor, the drive transistor has a source connected with the first auxiliary electrode and a drain connected with a first electrode of a light emitting device, a second electrode of the light emitting device is connected with the second auxiliary electrode.

15 Claims, 4 Drawing Sheets

(51) Int. Cl.
*H10K 59/126* (2023.01)
*H10K 102/00* (2023.01)

(58) Field of Classification Search
CPC ........ H10K 59/80; H10K 77/00; H10K 59/12; H01L 27/1244
See application file for complete search history.

(56) References Cited

U.S. PATENT DOCUMENTS

| | | | |
|---|---|---|---|
| 2018/0151828 A1* | 5/2018 | Im | H10K 50/805 |
| 2019/0109680 A1* | 4/2019 | Suh | H04L 5/0007 |
| 2020/0161397 A1* | 5/2020 | Pang | H10K 59/126 |
| 2020/0258958 A1* | 8/2020 | Gai | H10K 59/122 |
| 2020/0286976 A1* | 9/2020 | Noh | H10K 59/123 |
| 2020/0343326 A1* | 10/2020 | Park | G09G 3/3266 |
| 2021/0126016 A1* | 4/2021 | Li | H01L 29/78633 |
| 2022/0005797 A1* | 1/2022 | Ryu | H01L 25/167 |
| 2022/0093652 A1* | 3/2022 | Park | H01L 33/62 |
| 2022/0352252 A1* | 11/2022 | Lee | H01L 33/24 |
| 2023/0015395 A1* | 1/2023 | Lee | H01L 25/0753 |
| 2023/0200184 A1* | 6/2023 | Wang | H10K 59/65 |
| | | | 382/124 |

* cited by examiner

701 — Form a first metal layer on one side of a flexible base plate, wherein the first metal layer comprises a first auxiliary electrode, and the first auxiliary electrode is connected with a first power cord 702 — Form a pixel unit on one side of the flexible base plate away from the first metal layer, wherein the pixel unit comprises a plurality of thin-film transistors arranged on one side of the flexible base plate away from the first metal layer, and an insulation layer and a second auxiliary electrode that are arranged in a cascaded manner on one side of the plurality of thin-film transistors away from the flexible base plate, the insulating layer is arranged close to the flexible base plate, and the second auxiliary electrode is connected with a second power cord; wherein the plurality of thin-film transistors comprise a drive transistor, a source electrode of the drive transistor is connected with the first auxiliary electrode, a drain electrode of the drive transistor is connected with a first electrode of a light emitting device, and a second electrode of the light emitting device is connected with the second auxiliary electrode

Fig. 7

DISPLAYING SUBSTRATE FOR PREVENTING SHORT CIRCUIT BETWEEN AUXILIARY ELECTRODES, AND DISPLAYING DEVICE USING THE SAME

CROSS REFERENCE TO RELEVANT DISCLOSURES

The present application claims the priority of the Chinese patent application filed on Jan. 15, 2021 before the Chinese Patent Office with the application number of 202110057134.7 and the title of "DISPLAYING SUBSTRATE AND DISPLAYING DEVICE", which is incorporated herein in its entirety by reference.

TECHNICAL FIELD

The disclosure relates to the technical field of display, in particular to a displaying substrate and a displaying device.

BACKGROUND

For the technology of LED (Light Emitting Diode) display driven by thin-film transistors, since a drive current required for LED display is highly sensitive, a voltage drop of an auxiliary electrode has a great influence on the drive current. Therefore, a relatively large-area VDD auxiliary electrode and a relatively large-area VSS auxiliary electrode need to be manufactured in an LED displaying substrate to reduce resistance and pressure drop of trace.

SUMMARY

The disclosure provides a displaying substrate and a displaying device.

The disclosure discloses a displaying substrate, which comprises:
a flexible base plate;
a first metal layer arranged on one side of the flexible base plate and comprising a first auxiliary electrode, wherein the first auxiliary electrode is connected with a first power cord;
a pixel unit arranged on a side of the flexible base plate away from the first metal layer and comprising a plurality of thin-film transistors arranged on the side of the flexible base plate away from the first metal layer, and an insulation layer and a second auxiliary electrode arranged in layer configuration on a side of the plurality of thin-film transistors away from the flexible base plate, wherein the insulation layer is arranged close to the flexible base plate, and the second auxiliary electrode is connected with a second power cord;
wherein, the plurality of thin-film transistors comprise a drive transistor, a source of the drive transistor is connected with the first auxiliary electrode, a drain of the drive transistor is connected with a first electrode of a light emitting device, and a second electrode of the light emitting device is connected with the second auxiliary electrode.

Optionally, the displaying substrate further comprising:
a second metal layer;
and a flat layer;
wherein the second metal layer and the flat layer are arranged in layer configuration between the flexible base plate and the pixel unit, the second metal layer is arranged close to the flexible base plate, the second metal layer comprises a jumper electrode, the jumper electrode is connected with the first auxiliary electrode through a via hole formed in the flexible base plate, and the jumper electrode is further connected with the source of the drive transistor.

Optionally, an orthographic projection of the first auxiliary electrode on the flexible base plate covers an orthographic projection of the jumper electrode on the flexible base plate.

Optionally, an orthographic projection area of the first auxiliary electrode on the flexible base plate is equal to an orthographic projection area of the jumper electrode on the flexible base plate.

Optionally, a thickness of the flat layer is greater than or equal to 2 μm and less than or equal to 3 μm.

Optionally, the first metal layer further comprises a bonding electrode, the second metal layer further comprises a signal lead wire, and the signal lead wire is connected with the bonding electrode through a via hole formed in the flexible base plate.

Optionally, the drive transistor comprises a barrier layer, a light shielding layer, a buffer layer, an active layer, a grid insulating layer, a grid electrode, an interlayer dielectric layer and a source-drain electrode that are arranged in layer configuration on one side of the flat layer away from the flexible base plate;

Optionally, wherein the barrier layer is arranged close to the flexible base plate, the insulating layer is arranged on a side of a source-drain electrode away from the flexible base plate, the source-drain electrode comprises the source and the drain of the drive transistor, and the source of the drive transistor is connected with the jumper electrode though via holes formed in the interlayer dielectric layer, the grid insulating layer, the buffer layer, the barrier layer and the flat layer.

Optionally, an orthographic projection of the light shielding layer on the flexible base plate covers an orthographic projection of the active layer on the flexible base plate.

Optionally, a drive circuit of the pixel unit may comprise a plurality of thin-film transistors, wherein the thin-film transistors comprise at least one of the followings: switching transistor, compensating transistor, resetting transistor or drive transistor.

Optionally, the plurality of thin-film transistors further comprise a functional transistor, and the orthographic projection of the first auxiliary electrode on the flexible base plate covers an orthographic projection of the functional transistor on the flexible base plate.

Optionally, the orthographic projection of the first auxiliary electrode on the flexible base plate is overlapped with the orthographic projection of the second auxiliary electrode on the flexible base plate.

Optionally, the first auxiliary electrode is configured to transmit VDD signals, the second auxiliary electrode is configured to transmit VSS signals; or the first auxiliary electrode is configured to transmit VSS signals, and the second auxiliary electrode is configured to transmit VDD signals.

Optionally, the light emitting device comprises at least one of the followings: LED, Mini LED, Micro LED or OLED.

The disclosure discloses a displaying device, comprising the displaying substrate according to any one of the embodiments.

BRIEF DESCRIPTION OF THE DRAWINGS

To describe the technical solutions in the embodiments of the disclosure more clearly, the drawings required for describing the embodiments of the disclosure will be simply introduced below. Obviously, the drawings depicted below only illustrate some embodiments of the disclosure. Other drawings may further be obtained by a person of ordinary skill in the art according to these drawings without creative work.

DETAILED DESCRIPTION

To make the above purposes, features and advantages of the disclosure clearer and easily understood, the disclosure will be described in further detail below in conjunction with the accompanying drawings and specific embodiments.

Figure 1:
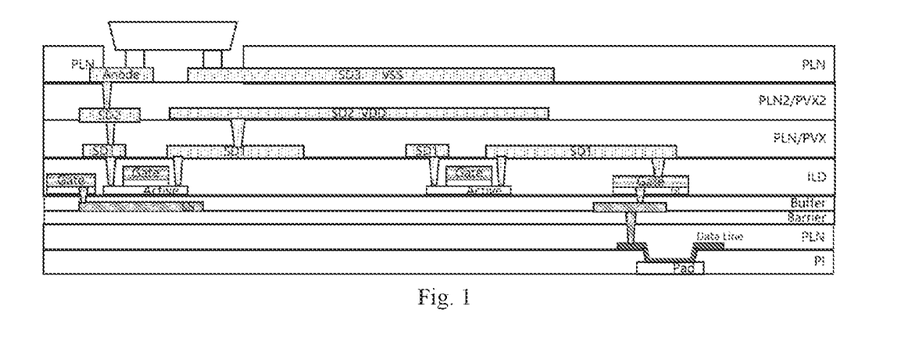
FIG. 1 illustrates a sectional structural diagram of a displaying substrate in related art.

In the related art, a large-area VDD auxiliary electrode and a large-area VSS auxiliary electrode are usually manufactured to reduce influences of a voltage drop of signals on LED current. The VDD auxiliary electrode is connected with VDD signal trace, and the VSS auxiliary electrode is connected with VSS signal trace. As shown in FIG. 1, only a relatively thin insulating layer (PLN2/PVX2) is arranged between the large-area VDD auxiliary electrode and the large-area VSS auxiliary electrode, so a short circuit may happen between the VDD auxiliary electrode and the VSS auxiliary electrode, thereby resulting in a failure to light up an entire panel and affecting the product yield and reliability.

Figure 3:
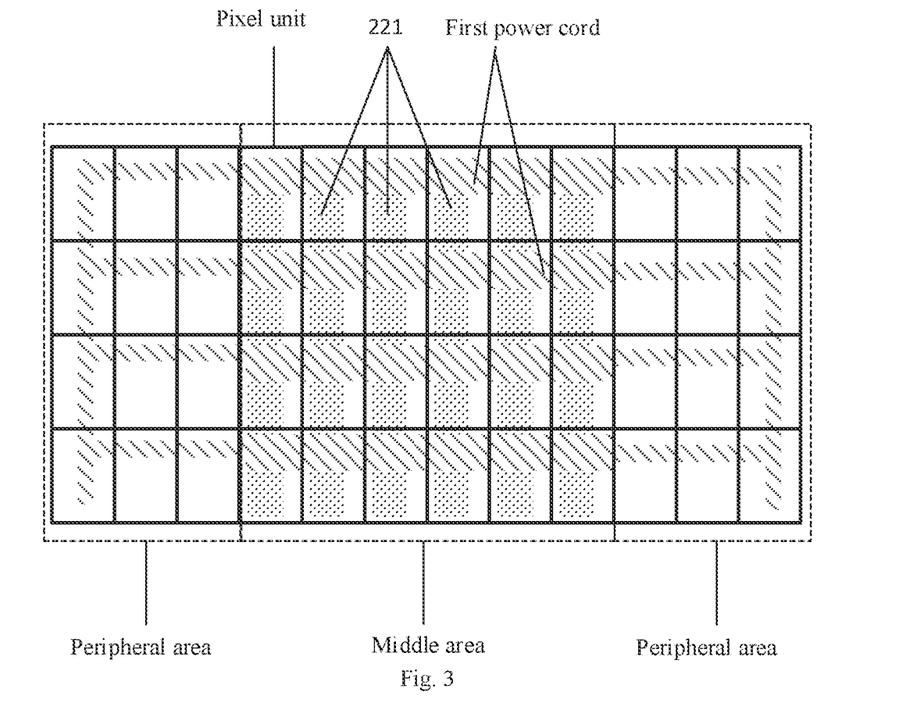
FIG. 3 illustrates a planar structural diagram of a first auxiliary electrode according to the embodiments of the disclosure.
Figure 4:
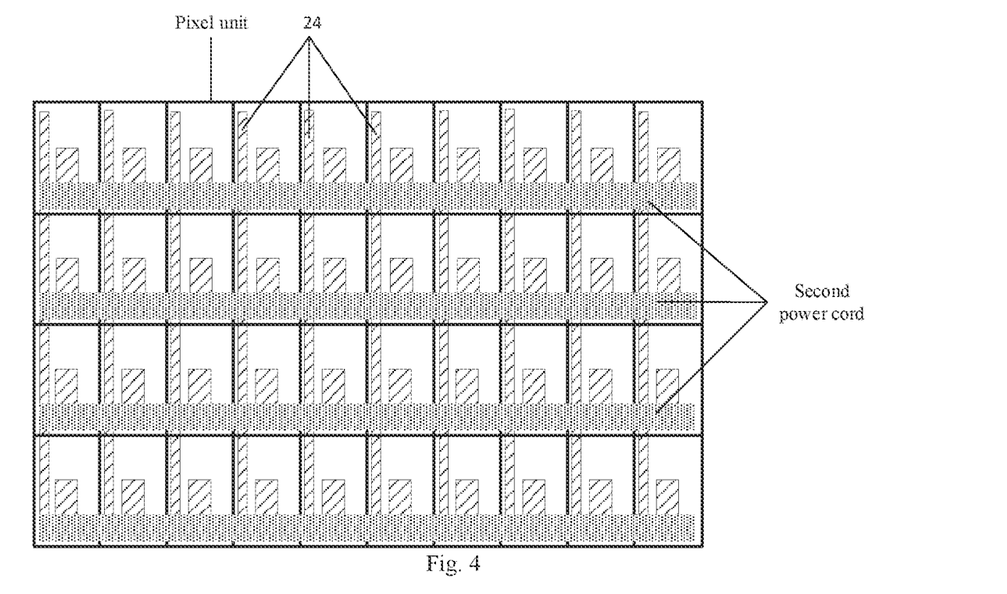
FIG. 4 illustrates a planar structural diagram of a second auxiliary electrode according to the embodiments of the disclosure.

To solve the above-mentioned problems, an embodiment of the disclosure provides a displaying substrate. Referring FIG. 2, which illustrates a sectional structural diagram of a displaying substrate according to this embodiment, the displaying substrate comprises a flexible base plate 21; a first metal layer 22 arranged on one side of the flexible base plate 21, wherein the first metal layer 22 comprises a first auxiliary electrode 221, and the first auxiliary electrode 221 is connected with a first power cord, as shown in FIG. 3; at least one pixel unit arranged on a side of the flexible base plate 21 away from the first metal layer 22, wherein the at least one pixel unit comprises a plurality of thin-film transistors (FIG. 2 schematically illustrates two thin-film transistors 25 and 29) arranged on the side of the flexible base plate 21 away from the first metal layer 22, and an insulating layer 23 and a second auxiliary electrode 24 arranged in layer configuration on a side of the plurality of thin-film transistors away from the flexible base plate 21, the insulating layer 23 is arranged close to the flexible base plate 21, and the second auxiliary electrode 24 is connected with a second power cord, as shown in FIG. 4.

Figure 2:
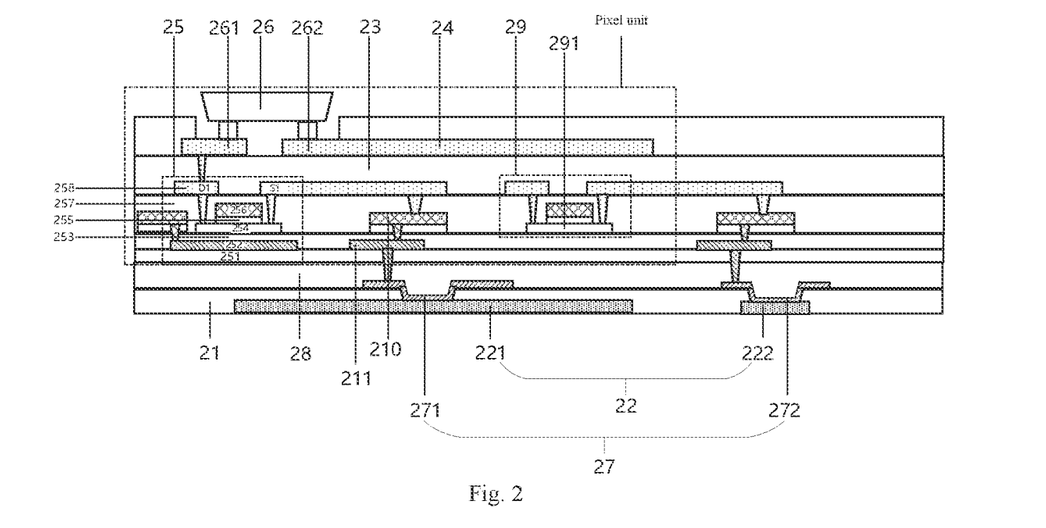
FIG. 2 illustrates a sectional structural diagram of a displaying substrate according to the embodiments of the disclosure.

Referring to FIG. 2, the plurality of thin-film transistors comprise a drive transistor 25. The drive transistor 25 is configured to drive a light emitting device 26 to emit light. A source S1 of the drive transistor 25 is connected with the first auxiliary electrode 221, and a drain D1 of the drive transistor 25 is connected with a first electrode 261 of the light emitting device 26. A second electrode 262 of the light emitting device 26 is connected with the second auxiliary electrode 24.

According to this embodiment, the first power cord may be made of the same material and arranged on the same layer as the first auxiliary electrode 221. Referring to FIG. 3 which illustrates a planar structural diagram of the distribution of the first auxiliary electrode, the first metal layer 22 may comprise a plurality of first auxiliary electrodes 221. Each of the first auxiliary electrodes 221 is connected to the first power cord, and all of the first auxiliary electrodes 221 communicate with one another through the first power cord to ensure the uniformity of voltage.

The corresponding relationship between each of the first auxiliary electrodes 221 and the pixel unit may be diversified. For example, one pixel unit may be correspondingly provided with one first auxiliary electrode 221 (as shown in FIG. 3), or a plurality of pixel units share one first auxiliary electrode 221, etc. In actual disclosure, when a plurality of pixel units share one first auxiliary electrode 221, the sources of the drive transistors of the plurality of pixel units may be interconnected to ensure the uniformity of the operating voltage and reduce the number of holes.

It should be noted that, the shape of the first auxiliary electrode 221 is not limited to the rectangular shape as shown in FIG. 3. The shape of the first auxiliary electrode 221 may be designed upon actual demands, for example, a regular polygon, a round, or other irregular shape, solid or hollowed shape, etc. The specific shape of the first auxiliary electrode 221 is not limited in this embodiment.

According to this embodiment, the second power cord may be made of the same material and arranged on the same layer as the second auxiliary electrode 24. Referring to FIG. 4 which illustrates a planar structural diagram of the distribution of the second auxiliary electrode, each of the pixel units may be correspondingly provided with one second auxiliary electrode 24, and each of the second auxiliary electrodes 24 is connected to the second power cord. All of the second auxiliary electrodes 24 communicate with one another through the second power cord to ensure the uniformity of voltage.

Figure 5:
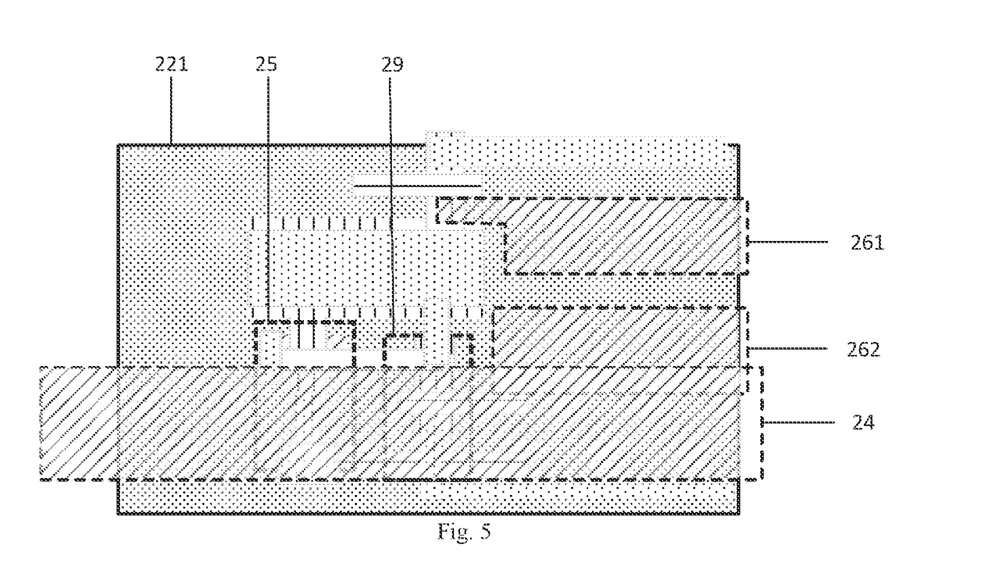
FIG. 5 illustrates a planar structural diagram of a displaying substrate according to the embodiments of the disclosure.

According to this embodiment, the orthographic projection of the first auxiliary electrode 221 on the flexible base plate 21 may be overlapped with the orthographic projection of the second auxiliary electrode 24 on the flexible base plate 21. Refer to FIG. 5 which illustrates a planar structural diagram of a displaying substrate. By adopting the displaying substrate according to this embodiment, since the distance between the first auxiliary electrode 221 and the second auxiliary electrode 24 is increased, the risk of a short circuit between the first auxiliary electrode 221 and the second auxiliary electrode 24 may be lowered, even if the orthographic projections of the first auxiliary electrode 221 and the second auxiliary electrode 24 on the flexible base plate 21 are overlapped.

The connection between the source S1 of the drive transistor 25 and the first auxiliary electrode 221 may be implemented by a plurality of methods, for example, the source S1 of the drive transistor 25 and the first auxiliary electrode 221 may be connected through a via hole formed in a film layer (including the flexible base plate 21) therebetween. In actual disclosure, the method of connection between the source S1 of the drive transistor 25 and the first auxiliary electrode 221 may be determined upon the actual structure of the drive transistor 25. The drive transistor 25 may be of a top grid structure, a bottom grid structure, a dual grid structure, etc. The specific structure of the drive transistor 25 is not limited in this embodiment. The embodiments below will give detailed description in conjunction with the specific structure of the drive transistor 25.

The connection between the drain D1 of the drive transistor 25 and the first electrode 261 of the light emitting device 26 may be implemented by a plurality of methods. For example, the first electrode 261 of the light emitting device 26 and the drain D1 of the drive transistor 25 may be connected though a via hole formed in the insulating layer 23 when the first electrode 261 of the light emitting device 26 and the second auxiliary electrode 24 are arranged on the same layer.

The connection between the second electrode 262 of the light emitting device 26 and the second auxiliary electrode 24 may be implemented by a plurality of methods. For example, the second electrode 262 of the light emitting device 26 and the second auxiliary electrode 24 may be in a direct contact connection when the second electrode 262 of the light emitting device 26 and the second auxiliary electrode 24 are located on the same layer.

To reduce a voltage drop, the first metal layer 22 and the second auxiliary electrode 24 may be made of metallic materials with relatively low resistivity, for example, aluminum or aluminum alloys, copper or copper alloys, etc.

For the displaying substrate according to this embodiment, the distance between the first auxiliary electrode and the second auxiliary electrode is increased by arranging the first auxiliary electrode and the second auxiliary electrode on two sides of the flexible base plate, the thin-film transistors and the insulating layer, thereby lowering the risk of a short circuit between the first auxiliary electrode and the second auxiliary electrode and enhancing the product yield and reliability.

In addition, FIG. 1 illustrates a displaying substrate in the related art. Above the thin-film transistors, an insulating layer PLN/PVX located between the thin-film transistor and a metal layer VDD, the metal layer VDD, an insulating layer PLN2/PVX2 located between the metal layer VDD and a metal layer VSS, and the metal layer VSS need to be arranged, that is, two metal layers and two insulating layers need to be arranged above the thin-film transistors. The manufacturing process is complicated and costs a lot of time. According to this embodiment, the displaying substrate may achieve the functions the same as those in FIG. 1 by arranging the first auxiliary electrode 221 on a side of the flexible base plate 21 away from the second auxiliary electrode 24, as shown in FIG. 2, and arranging one insulating layer 23 and one metal layer (the second auxiliary electrode 24) above the thin-film transistors.

Therefore, comparing with the related art, by arranging the first auxiliary electrode on the side of the flexible base plate away from the second auxiliary electrode, the manufacturing process of at least one insulating layer may be reduced, the process flow is simplified, the product yield is enhanced, and costs are reduced. When the first auxiliary electrode and a bonding electrode on the back of the displaying substrate are formed on the same layer (which will be described in details in the embodiments below), the manufacturing process of one metal layer may be reduced, the process flow is simplified, the product yield is enhanced, and costs are reduced.

According to an optional implementation, the first power cord may be a VDD (high-potential operating voltage) signal wire, and the second power cord may be a VSS (low-potential public voltage) signal wire. According to this implementation, the first auxiliary electrode 221 is configured to transmit VDD signals, and the second auxiliary electrode 24 is configured to transmit VSS signals. The first electrode 261 of the light emitting device 26 is an anode, and the second electrode 262 of the light emitting device 26 is a cathode.

According to an optional implementation, the first power cord may be a VSS (low-potential public voltage) signal wire, and the second power cord may be a VDD (high-potential operating voltage) signal wire. According to another implementation, the first auxiliary electrode 221 is configured to transmit VSS signals, and the second auxiliary electrode 24 is configured to transmit VDD signals. The first electrode 261 of the light emitting device 26 is a cathode, and the second electrode 262 of the light emitting device 26 is an anode.

According to this embodiment, the light emitting device 26 may be an LED, a Mini LED, a Micro LED, or an OLED.

According to an optional implementation, referring to FIG. 2, a second metal layer 27 and a flat layer 28 are arranged in layer configuration between the flexible base plate 21 and the pixel unit, wherein the second metal layer 27 is arranged close to the flexible base plate 21, the second metal layer 27 comprises a jumper electrode 271, the jumper electrode 271 is connected with the first auxiliary electrode 221 through a via hole formed in the flexible base plate 21, and the jumper electrode 271 is further connected with the source S1 of the drive transistor 25.

According to this implementation, the jumper electrode 271 is connected with the first auxiliary electrode 221 and the source S1 of the drive transistor 25, so that contact resistance is lowered, a voltage drop is reduced, the hole depth is reduced, and the process difficulty is lowered.

To further reduce the voltage drop, the second metal layer 27 may be made of metallic materials with relatively low resistivity, for example, aluminum or aluminum alloys, copper or copper alloys, etc.

Wherein, the orthographic projection of the first auxiliary electrode 221 on the flexible base plate 21 may cover the orthographic projection of the jumper electrode 271 on the flexible base plate 21. That is, the orthographic projection of the jumper electrode 271 on the flexible base plate 21 falls within the orthographic projection of the first auxiliary electrode 221 on the flexible base plate 21.

Figure 6:
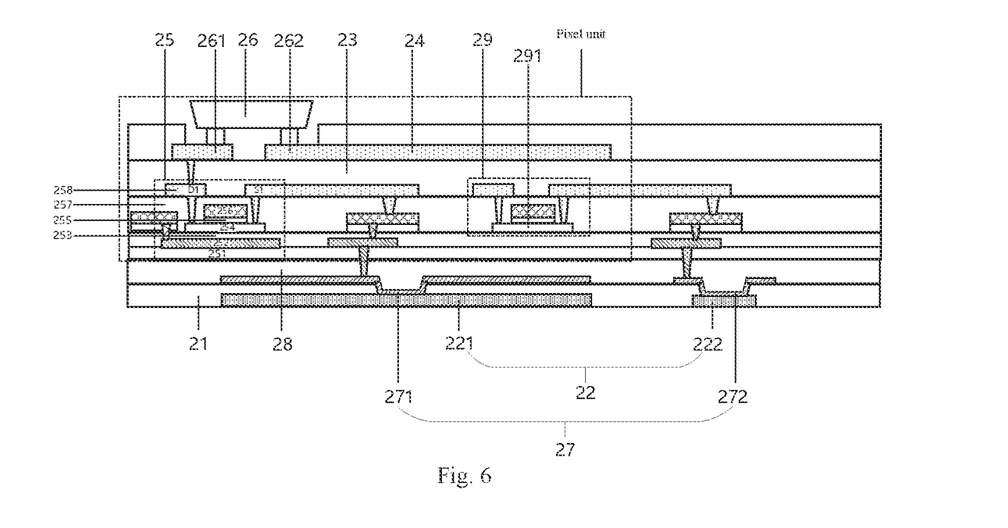
FIG. 6 illustrates a sectional structural diagram of another displaying substrate according to the embodiments of the disclosure.

To further reduce the voltage drop, as shown in FIG. 6, the orthographic projection area of the first auxiliary electrode 221 on the flexible base plate 21 may be equal to the orthographic projection area of the jumper electrode 271 on the flexible base plate 21. In this way, by increasing the area of the jumper electrode 271, signals transmitted by the first auxiliary electrode 221 are jointly transmitted by two metal layers, namely the jumper electrode 271 and the first auxiliary electrode 221, thereby lowering the resistance on the signal transmission path and reducing the voltage drop of signals.

Wherein, the orthographic projection of the first auxiliary electrode 221 on the flexible base plate 21 may be partly or completely overlapped (as shown in FIG. 6) with the orthographic projection of the jumper electrode 271 on the flexible base plate 21. The overlapping pattern is not limited in this embodiment.

When the orthographic projection area of the first auxiliary electrode 221 on the flexible base plate 21 is equal to the orthographic projection area of the jumper electrode 271 on the flexible base plate 21, the thickness of the flat layer 28 may be greater than or equal to 2 μm and less than or equal to 3 μm so as to avoid parasitic capacitance or electrode coupling occurring between the jumper electrode 271 and the metal layer in the thin-film transistor. The distance between the jumper electrode 271 and each of the metal layers in the thin-film transistor is prolonged by increasing the thickness of the flat layer 28, thereby avoiding the influence of parasitic capacitance or electrode coupling.

According to an optional implementation, referring to FIG. 2, the drive transistor 25 may comprise: a barrier layer 251, a light shielding layer 252, a buffer layer 253, an active layer 254, a grid insulating layer 255, a grid electrode 256, an interlayer dielectric layer 257 and a source-drain electrode 258 that are arranged in layer configuration on a side of the flat layer 28 away from the flexible base plate 21, wherein the barrier layer 251 is arranged close to the flexible base plate 21, the insulating layer 23 is arranged on one side of the source-drain electrode 258 away from the flexible base plate 21, the source-drain electrode 258 comprises the source S1 and the drain D1 of the drive transistor 25, and the source S1 of the drive transistor 25 may be connected with the jumper electrode 271 through via holes formed in the interlayer dielectric layer 257, the grid insulating layer 255, the buffer layer 253, the barrier layer 251 and the flat layer 28.

Specifically, referring to FIG. 2, the source S1 of the drive transistor 25 may be connected to a metal grid layer 210 through a via hole in the interlayer dielectric layer 257; the metal grid layer 210 is connected to a metal light shielding layer 211 through via holes in the grid insulating layer 255 and the buffer layer 253; and the metal light shielding layer 211 is connected to the jumper electrode 271 through via holes on the barrier layer 251 and the flat layer 28. Such method for connection between the source S1 of the drive transistor 25 and the jumper electrode 271 may lower the contact resistance and reduce the voltage drop, and additionally, may also reduce hole depth and lower the process difficulty.

Wherein, the metal grid layer 210 may be made of the same material as the grid electrode 256 and formed synchronously to the grid electrode, and the metal light shielding layer 211 may be made of the same material as the light shielding layer 252 and formed synchronously to the light shielding layer.

To protect the active layer 254 of the drive transistor 25 against influences from light rays, the orthographic projection of the light shielding layer 252 on the flexible base plate 21 may cover the orthographic projection of the active layer 254 of the drive transistor 25 on the flexible base plate 21. In this way, the light shielding layer 252 may protect the drive transistor 25 against influences from light rays, further improving the reliability of the product.

It should be noted that, the barrier layer 251, the light shielding layer 252 and the buffer layer 253 in the drive transistor 25 are not necessary, and one or more of three layers may be selectively arranged upon actual demands.

To protect the active layers of other thin-film transistors against influences from light rays, according to an optional implementation, referring to FIG. 2, the plurality of thin-film transistors may further comprise a functional transistor 29, and the orthographic projection of the light shielding layer 221 on a flexible base plate 21 may cover the orthographic projection of the active layer 291 of the functional transistor 29 on the flexible base plate 21. In this way, the first auxiliary electrode 221 may protect the functional transistor 29 against influences from light rays, further improving the reliability of the product.

Wherein, a drive circuit of the pixel unit may comprise a plurality of thin-film transistors, for example at least one of a switching transistor, a compensating transistor, a resetting transistor, a drive transistor, etc.

According to this embodiment, the functional transistor 29 may comprise one or several of the thin-film transistors of the drive circuit, that is, the functional transistor 29 may comprise one or several of the switching transistor, the compensating transistor, the resetting transistor, the drive transistor, etc.

During specific implementation, the inventor of the disclosure also found that AMLED (Active Matrix Light Emitting Diode) bonding technologies are classified in types: a lateral bending connection technology and a flexible backplane drilling technology. Wherein, the lateral bending connection technology refers to a process of manufacturing thin-film transistors on the front of glass, manufacturing electrode trace and the bonding electrode on the back of glass, and finally performing lateral bonding of the thin-film transistors and the electrode trace. Such process generates influences on the front when the back is manufactured, and lateral bonding needs to be carried out after glass cutting, so the process is relatively difficult.

Therefore, to further reduce the process difficulty, according to an optional implementation, referring to FIG. 2, the first metal layer 22 may further comprise the bonding electrode 222, the second metal layer 27 may further comprise a signal lead wire 272, and the signal lead wire 272 is connected with the bonding electrode 222 through a via hole formed in the flexible base plate 21.

Wherein, the signal lead wire 272 may be a lead wire for data signals, grid signals, VDD signals or VSS signals.

According to this embodiment, as shown in FIG. 3, the flexible base plate 21 may be divided into a middle area and a peripheral area around the middle area. The orthographic projection, on the flexible base plate 21, of the first auxiliary electrode 221 in the first metal layer 22 may be located in the middle area, and the orthographic projection, on the flexible base plate 21, of the bonding electrode 222 in the first metal layer 22 may be located in the peripheral area. Of course, the specific positions of the first auxiliary electrode 221 and the bonding electrode 222 may be set upon actual situations, and are not limited in this embodiment.

According to this implementation, the flexible backplane drilling technology is adopted.

That is, the first metal layer 22 is manufactured on a glass base plate first, wherein the first metal layer 22 comprises the bonding electrode 222 and the first auxiliary electrode 221; then, the flexible base plate 21, the second metal layer 27, the flat layer 28 and the pixel unit are manufactured in turn on the first metal layer 22, wherein the second metal layer 27 comprises the signal lead wire 272 and the jumper electrode 271, the signal lead wire 272 is connected with the bonding electrode 222 through a via hole formed in the flexible base plate 21, and the jumper electrode 271 is connected with the first auxiliary electrode 221 via another hole formed on the flexible base plate 21. When manufacturing of the pixel unit and the electrodes of an LED is completed, a flat layer may also be coated to expose the electrodes of the LED; then, the glass base plate is removed to expose the first auxiliary electrode 221 and the bonding electrode 222, and the subsequent bonding and assembling procedures are carried out later. Use of the flexible backplane drilling technology avoids the double-sided treatment and lateral bonding, so the process is easy and highly feasible, and frame-less display may be implemented.

Another embodiment of the disclosure further provides a displaying device, comprising the displaying substrate according to any one of the embodiments.

It should be noted that, the displaying device according to this embodiment may be any product or part with a 2D or 3D display function, such as a display panel, electronic paper, mobile phone, tablet personal computer, television, notebook computer, digital photo frame, navigator, etc.

Figure 7:
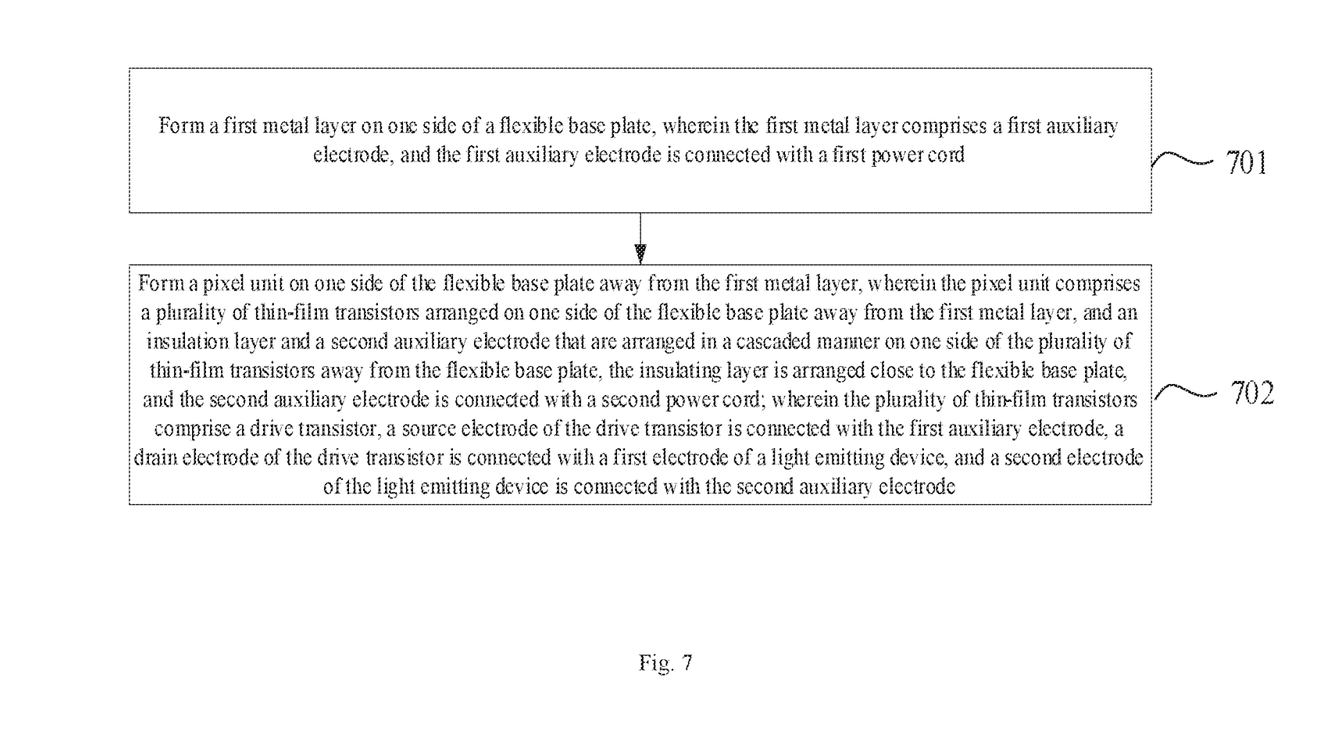
FIG. 7 illustrates a flowchart of a manufacturing method of a displaying substrate according to the embodiments of the disclosure.

Another embodiment of the disclosure further provides a manufacturing method of the displaying substrate. Referring to FIG. 7, the manufacturing method comprises the following steps:

Step 701: a first metal layer is formed on one side of a flexible base plate, wherein the first metal layer comprises a first auxiliary electrode, and the first auxiliary electrode is connected with a first power cord.

Step 702: a pixel unit is formed on a side of the flexible base plate away from the first metal layer, wherein the pixel unit comprises a plurality of thin-film transistors arranged on the side of the flexible base plate away from the first metal layer, and an insulating layer and a second auxiliary electrode that are arranged in layer configuration on a side of the plurality of thin-film transistors away from the flexible base plate, the insulating layer is arranged close to the flexible base plate, and the second auxiliary electrode is connected with a second power cord; wherein the plurality of thin-film transistor comprise a drive transistor, a source of the drive transistor is connected with the first auxiliary electrode, a drain of the drive transistor is connected with a first electrode of a light emitting device, and a second electrode of the light emitting device is connected with the second auxiliary electrode.

According to an optional implementation, step 701 may specifically comprise: providing a hard base plate first; second, forming the first metal layer on the hard base plate; and finally, forming the flexible base plate on a side of the first metal layer away from the hard base plate. After step 702, this implementation may further comprise peeling off the hard base plate to obtain the displaying substrate.

According to an optional implementation, prior to step 702, the method may further comprise: forming a second metal layer and a flat layer in layer configuration on a side of the flexible base plate away from the first metal layer, wherein the second metal layer comprises a jumper electrode and a signal lead wire, the jumper electrode is connected with the first auxiliary electrode through a via hole formed in the flexible base plate, the jumper electrode is also connected with the source of the drive transistor, and the signal lead wire is connected with a bonding electrode through a via hole formed in the flexible substrate; and correspondingly, step 702 may specifically comprise: forming the pixel unit on a side of the flat layer away from the flexible base plate.

Specifically, the first metal layer may be formed through patterning on the hard base plate such as a glass substrate first, wherein the first metal layer comprises the bonding electrode and the first auxiliary electrode; second, the flexible base plate such as PI (Polyimide) and the second metal layer are manufactured in turn on the first metal layer, wherein the second metal layer comprises the signal lead wire and the jumper electrode, the signal lead wire is connected with the bonding electrode through a via hole formed in the flexible base plate, and the jumper electrode is connected with the first auxiliary electrode via another hole formed in the flexible base plate; third, the flat layer and the pixel unit are manufactured on the second metal layer; fourth, another flat layer may be coated to expose electrodes of the LED after manufacturing of the pixel unit and the electrodes of the LED is completed; and finally, the glass substrate is removed to expose the first auxiliary electrode and the bonding electrode, and then bonding and assembling are performed.

The displaying substrate according to any one of the above embodiments is able to be manufactured by adopting the manufacturing method according to this embodiment. The structure and beneficial effects of the manufactured displaying substrate may be understood with reference to the description of the aforementioned embodiments, and are not repeated here.

The embodiments of the disclosure provide a displaying substrate and a displaying device. The displaying substrate comprises the flexible base plate; the first metal layer arranged on one side of the flexible base plate, wherein the first metal layer comprises the first auxiliary electrode, and the first auxiliary electrode is connected with the first power cord; and the pixel unit arranged on s side of the flexible base plate away from the first metal layer, wherein the pixel unit comprises a plurality of thin-film transistors arranged on the side of the flexible base plate away from the first metal layer, and the insulation layer and the second auxiliary electrode that are arranged in layer configuration on a side of the plurality of thin-film transistors away from the flexible base plate, the insulating layer is arranged close to the flexible base plate, and the second auxiliary electrode is connected with the second power cord; wherein the plurality of thin-film transistors comprise the drive transistor, the source of the drive transistor is connected with the first auxiliary electrode, the drain of the drive transistor is connected with the first electrode of the light emitting device, and the second electrode of the light emitting device is connected with the second auxiliary electrode. According to the technical solution of the disclosure, the distance between the first auxiliary electrode and the second auxiliary electrode is increased by locating the first auxiliary electrode and the second auxiliary electrode on two sides of the flexible base plate, the thin-film transistors and the insulating layer, thereby greatly reducing the probability of a short circuit between the first auxiliary electrode and the second auxiliary electrode, and assisting in enhancement of the product yield and reliability. In addition, the first auxiliary electrode is arranged on a side of the flexible base plate away from the second auxiliary electrode, so comparing with existing structures, the manufacturing process of at least one insulating layer may be reduced, the process flow is simplified, and the product yield is enhanced.

The embodiments in this specification are described progressively, and differ in respective highlights. Similar or identical contents of the embodiments may be used for mutual reference.

Finally, it should be noted that relational terms in this specification such as "first" and "second" are merely used to distinguish one entity or operation from the other one, and do not definitely indicate or imply any actual relation or sequence between these entities or operations. In addition, the terms "comprise" and "include" and any other variations are intended to refer to non-exclusive inclusion, so a process, method, article or device comprising a series of elements not only comprise those elements listed, but also include other elements that are not explicitly listed or inherent elements of the process, method, article or device. In the absence of more restrictions, a process, method, article or device comprising an element defined by "one" shall not exclusive of other identical elements.

The above describes in detail the displaying substrate and displaying device according to the embodiments of the disclosure. In this specification, the principle and implementation of the disclosure are expounded by means of specific embodiments, which are described merely for assisting those skilled in the art in understanding the method and core concept of the disclosure. Moreover, those ordinarily skilled in the art may make variations to the specific embodiments and disclosure scope based on the idea of the disclosure. So, the contents in this specification should not be construed as limitations of the disclosure.

The invention claimed is:

1. A displaying substrate for preventing short circuit between auxiliary electrodes, wherein the auxiliary electrodes comprise a first auxiliary electrode and a second auxiliary electrode for reducing voltage drop of trace, and the displaying substrate comprises:
   a flexible base plate;
   a first metal layer arranged on one side of the flexible base plate and comprising the first auxiliary electrode, wherein the first auxiliary electrode is directly connected with a first power cord, the first auxiliary electrode is arranged on a same layer as the first power cord, the first auxiliary electrode is to ensure uniformity of voltage applied by the first power cord, and the first power cord is one of a VDD signal wire and a VSS signal wire; and
   a pixel unit arranged on a side of the flexible base plate away from the first metal layer, the pixel unit comprising:
      a plurality of thin-film transistors arranged on the side of the flexible base plate away from the first metal layer, and
      an insulation layer and the second auxiliary electrode arranged in layer configuration on a side of the plurality of thin-film transistors away from the flexible base plate, wherein the insulation layer is arranged between the second auxiliary electrode and the flexible base plate, the second auxiliary electrode is directly connected with a second power cord, the second auxiliary electrode is arranged on a same layer as the second power cord, the second auxiliary electrode is to ensure uniformity of voltage applied by the second power cord, and the second power cord is the other one of the VDD signal wire and the VSS signal wire;
   wherein the plurality of thin-film transistors comprise a drive transistor, a source of the drive transistor is connected with the first auxiliary electrode, a drain of the drive transistor is connected with a first electrode of a light emitting device, and a second electrode of the light emitting device is connected with the second auxiliary electrode;
   wherein the displaying substrate further comprises a second metal layer and a flat layer, wherein the second metal layer and the flat layer are arranged in layer configuration between the flexible base plate and the pixel unit, the second metal layer is arranged between the flat layer and the flexible base plate, the second metal layer comprises a jumper electrode, the jumper electrode is connected with the first auxiliary electrode through a via hole formed in the flexible base plate, and the jumper electrode is further connected with the source of the drive transistor;
   wherein the drive transistor comprises a barrier layer, a light shielding layer, a buffer layer, an active layer, a grid insulating layer, a grid electrode, an interlayer dielectric layer and a source-drain electrode that are arranged in layer configuration on one side of the flat layer away from the flexible base plate; and
   wherein the barrier layer is arranged between the light shielding layer and the flexible base plate, the insulating layer is arranged on a side of a source-drain electrode away from the flexible base plate, the source-drain electrode comprises the source and the drain of the drive transistor, and the source of the drive transistor is connected with the jumper electrode through via holes formed in the interlayer dielectric layer, the grid insulating layer, the buffer layer, the barrier layer and the flat layer.

2. The displaying substrate according to claim 1, wherein an orthographic projection of the first auxiliary electrode on the flexible base plate covers an orthographic projection of the jumper electrode on the flexible base plate.

3. The displaying substrate according to claim 1, wherein an orthographic projection area of the first auxiliary electrode on the flexible base plate is equal to an orthographic projection area of the jumper electrode on the flexible base plate.

4. The displaying substrate according to claim 3, wherein a thickness of the flat layer is greater than or equal to 2 μm and less than or equal to 3 μm.

5. The displaying substrate according to claim 1, wherein the first metal layer further comprises a bonding electrode, the second metal layer further comprises a signal lead wire, and the signal lead wire is connected with the bonding electrode through a via hole formed in the flexible base plate.

6. The displaying substrate according to claim 1, wherein an orthographic projection of the light shielding layer on the flexible base plate covers an orthographic projection of the active layer on the flexible base plate.

7. The displaying substrate according to claim 1, wherein a drive circuit of the pixel unit may comprise a plurality of thin-film transistors, wherein the thin-film transistors comprise at least one of the followings: switching transistor, compensating transistor, resetting transistor or drive transistor.

8. The displaying substrate according to claim 1, wherein the plurality of thin-film transistors further comprise a functional transistor, and the orthographic projection of the first auxiliary electrode on the flexible base plate covers an orthographic projection of the functional transistor on the flexible base plate.

9. The displaying substrate according to claim 1, wherein the orthographic projection of the first auxiliary electrode on the flexible base plate is overlapped with the orthographic projection of the second auxiliary electrode on the flexible base plate.

10. The displaying substrate according to claim 1, wherein the light emitting device comprises at least one of the followings: LED, Mini LED, Micro LED or OLED.

11. A displaying device, comprising the displaying substrate according to claim 1.

12. The displaying device according to claim 11, wherein an orthographic projection of the first auxiliary electrode on the flexible base plate covers an orthographic projection of the jumper electrode on the flexible base plate.

13. The displaying device according to claim 11, wherein an orthographic projection area of the first auxiliary electrode on the flexible base plate is equal to an orthographic projection area of the jumper electrode on the flexible base plate.

14. The displaying device according to claim 11, wherein the first metal layer further comprises a bonding electrode, the second metal layer further comprises a signal lead wire, and the signal lead wire is connected with the bonding electrode through a via hole formed in the flexible base plate.

15. The displaying device according to claim 13, wherein a thickness of the flat layer is greater than or equal to 2 μm and less than or equal to 3 μm.

\* \* \* \* \*